United States Patent
Sakamoto et al.

(10) Patent No.: US 6,687,985 B2
(45) Date of Patent: Feb. 10, 2004

(54) METHOD OF MANUFACTURING A MULTI-LAYER CIRCUIT BOARD

(75) Inventors: Kazunori Sakamoto, Katano (JP); Hideo Hatanaka, Katano (JP); Yukihiro Ishimaru, Hirakata (JP); Tosaku Nishiyama, Nara (JP)

(73) Assignee: Matsushita Electric Industrial Co., Ltd. (JP)

( * ) Notice: Subject to any disclaimer, the term of this patent is extended or adjusted under 35 U.S.C. 154(b) by 125 days.

(21) Appl. No.: 09/902,771

(22) Filed: Jul. 12, 2001

(65) Prior Publication Data

US 2002/0020554 A1 Feb. 21, 2002

Related U.S. Application Data

(63) Continuation of application No. 09/250,441, filed on Feb. 16, 1999, now Pat. No. 6,281,446.

(30) Foreign Application Priority Data

Feb. 16, 1998 (JP) ............................................. 10-032452

(51) Int. Cl.⁷ .......................... H05K 3/36; H05K 3/20; H01K 3/10
(52) U.S. Cl. .............................. 29/830; 29/831; 29/852; 174/250; 174/266
(58) Field of Search ............................ 29/830, 831, 852; 174/250, 266; 361/792

(56) References Cited

U.S. PATENT DOCUMENTS

| | | | | |
|---|---|---|---|---|
| 4,837,408 A | * | 6/1989 | Kondo et al. | 174/257 |
| 5,081,563 A | | 1/1992 | Feng et al. | 361/795 |
| 5,165,984 A | * | 11/1992 | Schoenthaler | 428/209 |
| 5,191,174 A | * | 3/1993 | Chang et al. | 174/266 |
| 5,562,971 A | | 10/1996 | Tsuru et al. | 174/255 X |
| 5,574,630 A | | 11/1996 | Kresge et al. | 361/792 |
| 5,688,408 A | | 11/1997 | Tsuru et al. | 216/17 |
| 5,847,935 A | | 12/1998 | Thaler et al. | 361/761 |
| 5,858,145 A | | 1/1999 | Sreeram et al. | 174/255 X |
| 5,917,707 A | | 6/1999 | Khandros et al. | 361/779 X |

FOREIGN PATENT DOCUMENTS

| | | |
|---|---|---|
| JP | 5-48231 | 2/1993 |
| JP | 6-268345 | 9/1994 |
| JP | 7-50482 | 2/1995 |
| JP | 9-46015 | 2/1997 |
| JP | 9-199824 | 7/1997 |
| JP | 10-4153 | 1/1998 |

* cited by examiner

Primary Examiner—Carl J. Arbes
Assistant Examiner—Thiem Dinh Phan
(74) Attorney, Agent, or Firm—Parkhurst & Wendel, L.L.P.

(57) ABSTRACT

A multilayer wiring board comprising a mother wiring board and a carrier wiring board, in which all of the composing layers have IVH structure. The mother wiring board (11) is formed in the manner that a plurality of resin-impregnated-fiber-sheets having mother wiring layers (13) and first inner-via-hole conductors (14) for connecting the wiring layers (13) each other are laminated. The mother wiring board (11) comprises a base board (11a) and container board (11b) having an opening for forming a cavity (15). The carrier wiring board (16) has lands (17) for mounting LSI bare chips, wirings (18), a plurality of carrier-board-wiring-layers (19) and second inner-via-hole conductors (20) for connecting the wiring layers (19) each other. The carrier wiring board (16) is set in the cavity (15) for electrically connecting the carrier wiring board (16) to the mother wiring board (11) by connecting carrier board electrodes (21) to mother board electrodes (22) through connectors (23) of solder balls, gold bumps or electrically conductive paste. The carrier wiring board (16) has higher wiring density at the portion where LSI bare chips are mounted, than the mother wiring board.

18 Claims, 14 Drawing Sheets

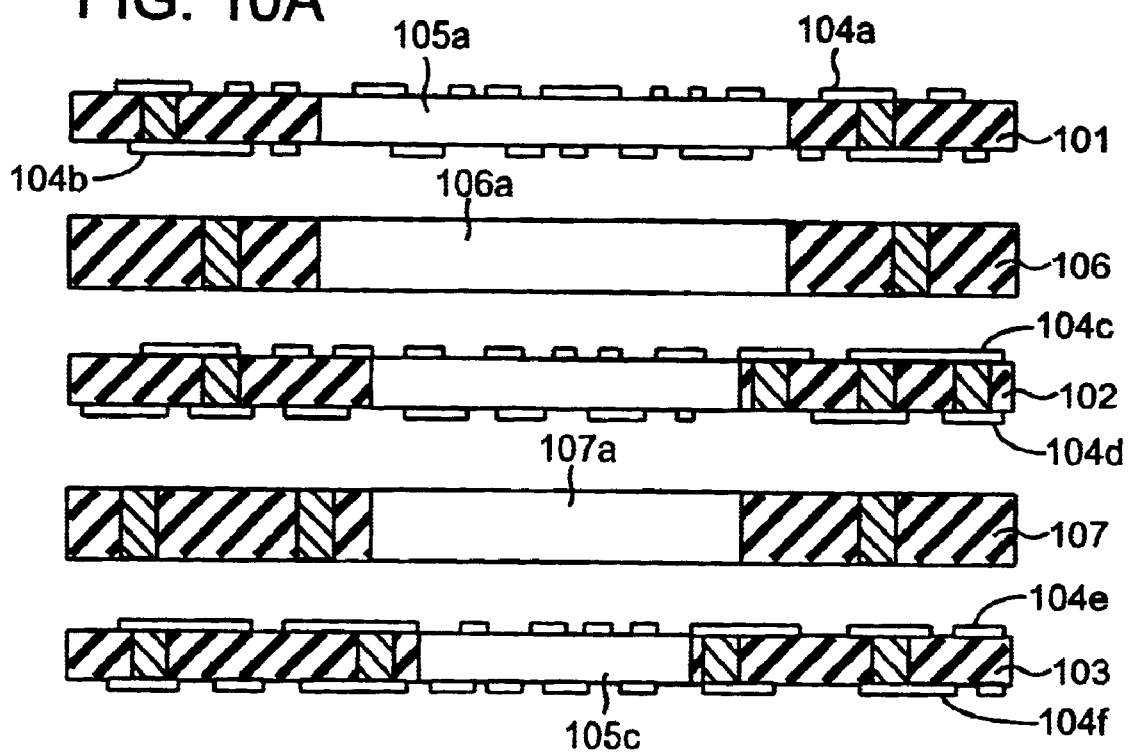
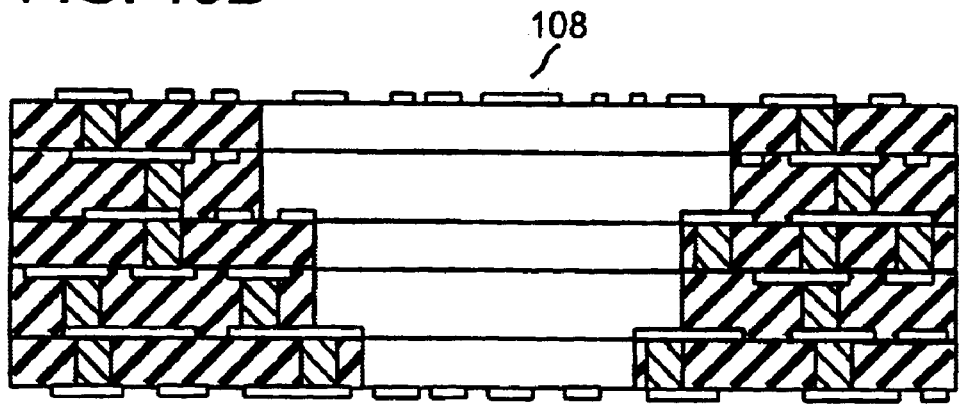

METHOD OF MANUFACTURING A MULTI-LAYER CIRCUIT BOARD

CROSS REFERENCE TO RELATED DOCUMENT

The present application is a continuation of application Ser. No. 09/250,441, now U.S. Pat. No. 6,281,446 B1 which was filed on Feb. 16th 1999.

FIELD OF THE INVENTION

The present invention relates to a multi-layer circuit or wiring board having a plurality of wiring layers and high density circuits for directly mounting high-density large-scale-integrated5- circuit (hereinafter referred to as LSI) chips and the method of manufacturing the same.

BACKGROUND OF THE INVENTION

In recent years, the printed circuit boards for the high density mounting of miniaturized electronic components has been actively developed under the trend of reducing size and weight of electronic equipment having high performance.

Especially the economical supply of multi-layer circuit boards for high density mounting of semiconductors such as LSI chips and for high speed data processing circuits is strongly desired. In such multi-layer circuit board, it is important to have high reliability in electrically connecting a plurality of layers of fine pitch wiring patterns to each other and to have superior high frequency characteristics. Therefore, circuit boards having new structures and new manufacturing methods are being developed because the old ones can hardly meet such requests. In the old multi-layer circuit boards, wiring layers are electrically connected with each other by conductors plated on the inner wall of a through-hole formed by drilling, and are manufactured by the etching of copper clad laminates and the metal plating.

A method proposed by the Japanese Laid Open Patent Application No. H06-268345 is a resinous multi-layer circuit board in which all composing layers have inner-via-hole (hereinafter referred to as IVH) structure for connecting wiring layers each other. The electrical conductors of the IVH structure are formed in the manner that electrically conductive material is filled into the IVHs. In this method, the reliability of electrical connection is improved, the IVHs can be formed just under the lands for mounting electronic components, and can be formed at any portion between the wiring layers. Accordingly, size reduction of the circuit board and high density mounting can be realized.

In general, the substrate for the above circuit board is formed in the manner that aramid non-woven fabric or the like is impregnated with epoxy resin that works as insulation material. The resinous multi-layer circuit board using the above aramid non-woven fabric has the advantages of low expansion, low dielectric constant and light weight, therefore the substrate is widely used for electronic equipment for reducing the size and weight.

However, in general, in the above resinous multi-layer circuit board having IVH structure on all of the composing layers, the wiring density such as wiring pitch and wiring width are determined to have similar wiring patterns on all of the circuit boards, because the wiring patterns are formed by conventional photolithography on a resinous substrate whose top side and bottom side are plated with metal such as copper or the like.

Therefore, in the above conventional method shown in FIG. 14, the wiring density of the area for mounting chip resistors, chip capacitors or resin-packaged LSI chips 3 is determined by the shape or size of discrete components such as a chip resistor, a chip capacitor and the like.

For reducing further the size of a circuit board 4, it is advisable to mount the LSI chips 3 in the form of bare chips in which the wiring density is high enough. However, if the high density area for the LSI bare chips and the relatively low density area for the discrete components are formed on one circuit board, the production yield of the circuit board becomes extremely low, which causes high cost of the circuit board.

For addressing this problem, several methods are proposed. Hereinafter the proposed methods and still existing problems are described.

The method of the Japanese Laid Open Patent Application No. H05-48231 is that a high density circuit board is set in a cavity formed on a circuit board having low wiring density. In this method, the two boards are electrically connected with each other by aligning electrical conductors of respective circuit boards, which are produced by a conventional through-hole process circuit boards. However, since all of the composing layers do not have an IVH structure, the circuit boards are electrically connected with each other through the electrical conductors exposed at the ends of the respective wiring boards. Accordingly the obtainable wiring density is not high enough in this method.

The method of the Japanese Laid Open Patent Application No. H09-46015 is that two circuit boards having respectively different wiring density are laminated. In this method, there are problems from delaying the electrical signal due to the increase of the length of the wiring lines, the increase of total thickness of the wiring boards, and that the flatness is insufficient or the height is not low enough.

The method of Japanese Laid Open Patent Application No. H09-199824 is that an opening or a cavity is formed on a multi-layer circuit board in which all of the composing layers have IVH structure. This method intended to realize high density mounting of electronic components and to decrease the height by mounting the components in the opening or in the cavity. However, in this method, the mounted components are resistors, capacitors and the like, and, it is not intended to set a circuit board having an IVH structure in the opening or in the cavity. Therefore, this method cannot realize the improvement of wiring density and production efficiency.

The method of Japanese Laid Open Patent Application No. H010-4153 is that a staircase-shape cavity is formed on a circuit board, LSI chips are set in the cavity, and the LSI chips are connected to wiring layers of the circuit board by a wire-bonding method. In this method, there are problems from delaying the electrical signal due to the increase of the length of the wiring lines, the increase of size due to unused space of the cavity, and the problems of no improvement on mounting density and production efficiency as in the above method of No. H09-199824.

SUMMARY OF THE INVENTION

The present invention aims to provide an economical and miniaturized multi-layer circuit board by further utilizing the advantages of a resinous multi-layer circuit board in which all of the composing layers have IVH structure, and to provide the method of manufacturing the multi-layer circuit boards having the above features. For that, a mother board and a carrier board having different wiring densities for fitting to respective mounted components are manufactured separately in former manufacturing processes and are combined together in a manufacturing process, which decrease the manufacturing cost of the circuit board and further miniaturizes the circuit board by enabling high density direct mounting of LSI bare chips.

In more detail, the mother board has a relatively low wiring density for mounting discrete components such as resistors, capacitors and the like. Accordingly the cost for manufacturing the mother board is relatively low. On the other hand, the carrier board has a high wiring density for mounting LSI bare chips. The mother board is electrically connected to the carrier board by setting the carrier board in a cavity formed on the mother board. The above structure and the manufacturing method of the multi-layer circuit board provide an economical multi-layer circuit board having high performances such as high speed and highly reliable electrical connection.

DESCRIPTION OF PREFERRED EMBODIMENTS

First Exemplary Embodiment

Figure 1:
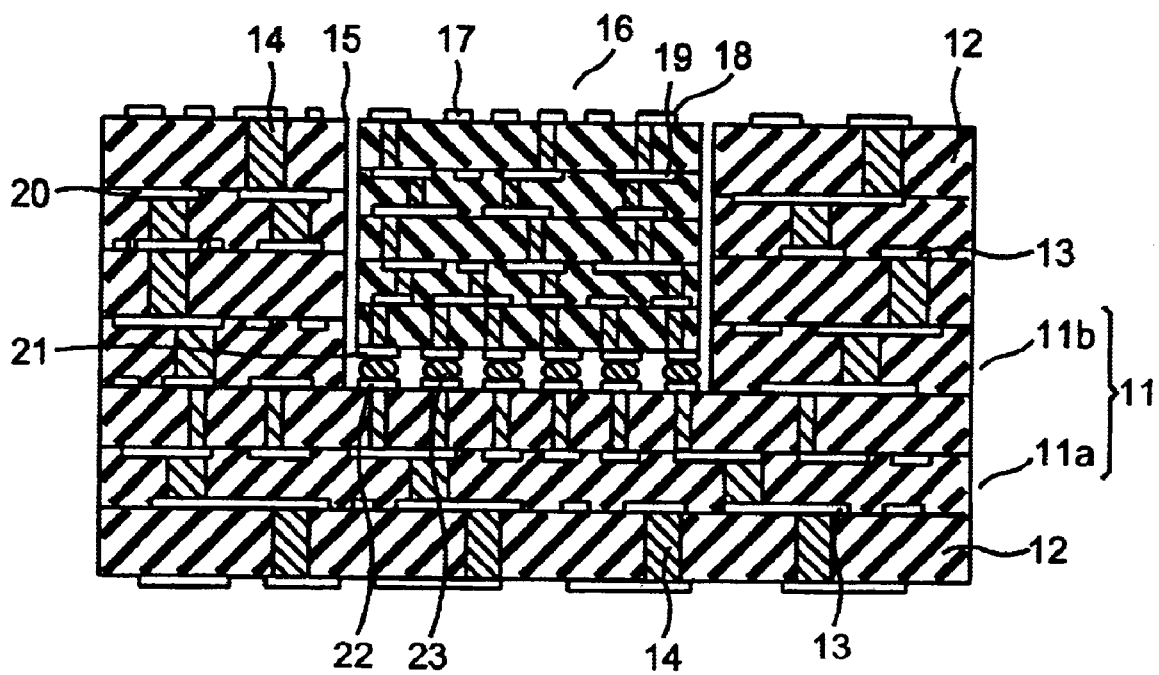
FIG. 1 shows the cross section of a portion of a multi-layer circuit board in a first exemplary embodiment of the present invention, FIGS. 2(a) and (b) show the cross sections of a portion of a multi-layer circuit board in a second exemplary embodiment of the present invention, FIGS. 3(a) and (b) are cross sectional views showing the assembling process of a base board in the method of manufacturing a multi-layer circuit board in a third exemplary embodiment of the present invention, FIGS. 4(a) and (b) are cross sectional views showing the assembling process of a container board in the method of manufacturing the same, FIGS. 5(a) and (b) are cross sectional views showing the assembling process of a mother board in the method of manufacturing the same, FIGS. 6(a) and (b) are cross sectional views showing the assembling process of a carrier board in the method of manufacturing the same, FIGS. 7(a) and (b) are cross sectional views showing the assembling process of a multi-layer circuit board in the method of manufacturing the same, FIGS. 8(a) and (b) are cross sectional views showing the assembling process of a base board of a multi-layer circuit board in a fourth exemplary embodiment in the method of manufacturing the same, FIGS. 9(a) and (b) are cross sectional views showing the assembling process of a container board in the method of manufacturing the same, FIGS. 10(a) and (b) are cross sectional views showing another structure of a container board of the fourth exemplary embodiment in the method of manufacturing the same, FIGS. 11(a) and (b) are cross sectional views showing the assembling process of a mother board in the fourth exemplary embodiment in the method of manufacturing the same, FIGS. 12(a) and (b) are cross sectional views showing the assembling process of a carrier board in the method of manufacturing the same, FIGS. 13(a) and (b) are cross sectional views showing the assembling process of a multi-layer circuit board in the method of manufacturing the same.

FIG. 1 shows the structure of a multi-layer circuit board in a first exemplary embodiment of the present invention. In FIG. 1, a mother board 11 in which all of the composing layers have IVH structure is formed by laminating a plurality of substrates 12 produced in the manner that aramid fiber or the like is impregnated with heat-curing-type-resin such as epoxy resin or the like, and the resin is cured. Mother-board-wiring-layers are electrically connected with each other by first via-hole conductors (hereinafter referred to as first IVH conductor) 14 formed in the through-holes of the substrates 12. The mother board 11 comprises a base board 11a and a container board 11b. As shown in FIG. 1, the container board 11b has at least one opening for forming a cavity 15 in which a carrier board 16 is set. In this case, it is advisable to fill up the remaining space of the cavity 15 with sealing resin for obtaining a long life reliability by protecting, from the surrounding environment, the portions where the mother board 11 is electrically connected to the carrier board 16.

The carrier board 16 has lands 17 for mounting electronic components such as LSI bare chips and wiring patterns 18 on the top side, a plurality of wiring layers 19 therein, and a second inner-via-hole conductors (hereinafter referred to as second IVH conductor) 20 for electrically connecting the wiring layers with each other. All layers of the carrier board 16 have an IVH structure as in the case of the motor board 11.

The circuits of the mother board 11 are electrically connected to that of the carrier board 16 in the manner that carrier board electrodes 21 formed on the bottom side of the carrier board 16 are connected to mother board electrodes 22 formed on the top side of the base board 11a that composes the bottom of the cavity 15 of the mother board 11, through connectors 23 of solder balls, gold bumps or electrically conductive paste.

At least the uppermost wiring patterns on which LSI bare chips are mounted out of a plurality of circuit boards of the carrier board 16 has a higher wiring density than any circuit board of the mother board 11.

The features and the effects of the multi-layer circuit board of this exemplary embodiment is described hereinafter.

A first feature is that the above multi-layer circuit board comprises two types of wiring boards, i.e., the mother board 11 on which discrete components such as resistors, capacitors, coils and connectors are mainly mounted for forming a main circuit, and the carrier board 16 on which LSI bare chips are mainly mounted. The number of the carrier boards 16 and the corresponding number of the containing cavities 15 formed on one mother board 11 are determined according to the required functions in the application to electronic equipment, or, a plurality of LSI chips can be mounted on one carrier board. Also an electronic circuit module can be formed on one carrier board.

A second feature is that the wiring density is different between the mother board 11 and the carrier board 16. The wiring density of the mother board 11 is relatively low, i.e., the wiring pitches of the mother board 11 are determined according to the shape of the terminal pitches of mounted discrete electronic components. While the wiring density of the carrier board 16 is higher than that of the mother board 11, i.e., the pitches of the wiring on the top side and the IVH conductors of the carrier board 16 is determined according to the extremely fine electrode pitches of LSI bare chips for the flip-chip-bonding. Accordingly, the manufacturing cost of the carrier board 16 becomes high because high technology for designing and manufacturing are required.

As described above, by manufacturing the low cost portion, viz., the mother board 11 separately, and by limiting the high cost portion to the carrier board 16 as in this embodiment, the total cost of the multi-layer circuit board can be decreased. Furthermore, since the LSI chips can be mounted directly on the carrier board 16, the size including the thickness of the whole circuit board can be reduced. The cost can also be reduced.

In other words, in the present invention, by the direct mounting of the exposed LSI chips instead of mounting resin or ceramic packaged LSI chips, the size including the thickness can be further reduced. Also, by manufacturing separately the extremely fine pitch portion for directly mounting exposed LSI chips, the production yield of the multi-layer circuit board can be improved.

Accordingly the production cost is reduced, compared to the method of forming a high wiring density portion and a low wiring density portion on one board.

Second Exemplary Embodiment

Hereinafter a second exemplary embodiment of the present invention is described referring to FIGS. 2(a) and (b), in which the same reference numerals are applied as in the first exemplary embodiment for the same elements. The difference of this exemplary embodiment from the first exemplary embodiment is in the shape of the cavity 32 formed on the mother board 31, and in the shape of the carrier board 33 set in the cavity 32 for electrically connecting to the mother board 31.

Figure 2A:
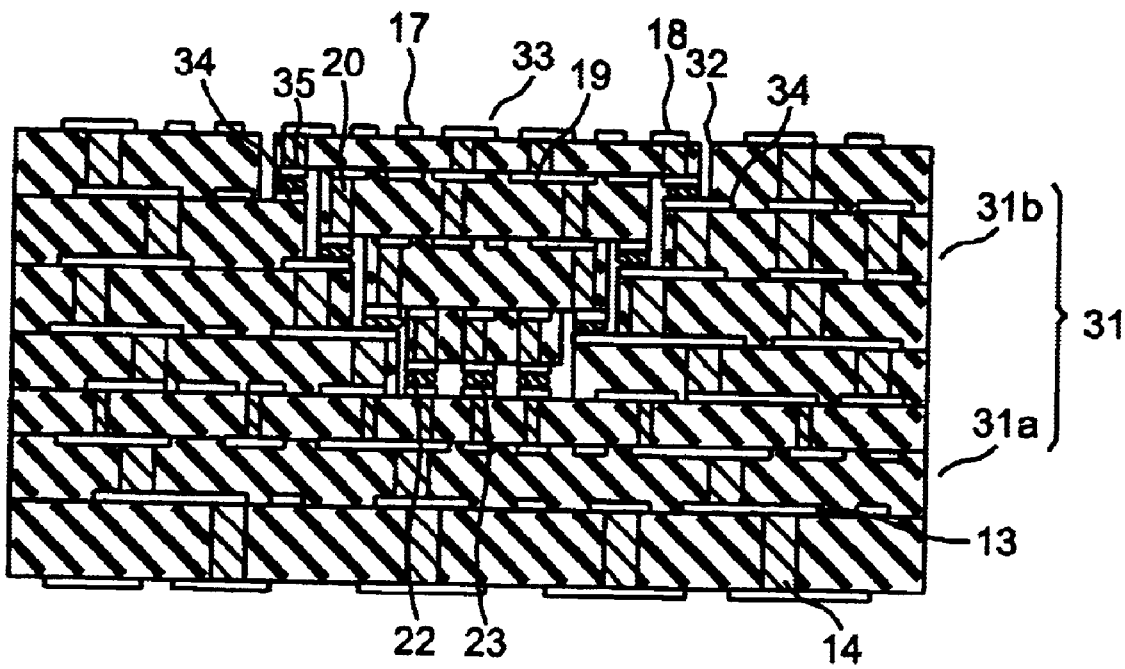

In more detail, as shown in FIG. 2(a), the portion of the cavity 32 of a container board 31b has a staircase-shape though a base board 31a composing the mother board 31 is almost the same as the base board 11a of the first exemplary embodiment. On the respective exposed flat portions of the staircase, container board electrodes 34 are formed. The carrier board 33 has a reversed staircase-shape for fitting to the staircase-shape of the container board 31b, and has carrier board electrodes 35 formed on the exposed flat portions of the reversed staircase. The carrier electrodes 35 are for connecting to the container board electrodes 34. In this exemplary embodiment, fewer base board electrodes 22 are formed on the exposed portion of the top side of a base board 31a than those in the first exemplary embodiment because the container board electrodes 34 are formed on the container board 31b.

The cavity 32 of the multi-layer circuit board of the present invention has four sides though only right and left sides of a staircase-shape are shown in FIG. 2(a) because the illustration shows the cross section of the multi-layer circuit board. Therefore the staircase structure can be formed on one, two, three or four sides of the cavity 32.

The features and the effects of the multi-layer circuit board having the above structure are described hereinafter. As shown in FIG. 2(a) stairs of the mother board 31 and those of the carrier board 33 fit each other in the manner that the mother board electrodes 22 and 34 on the flat portions of the mother board 31 are directly connected to the carrier board electrodes 35 on the flat portions of the carrier board 33. Accordingly the wiring structure inside the carrier board 33 can be, simplified and the total length of the wiring lines can be reduced. Therefore, the size of the multi-layer circuit board can be reduced and the data transfer speed can be increased by the decrease in wiring resistance.

Figure 2B:
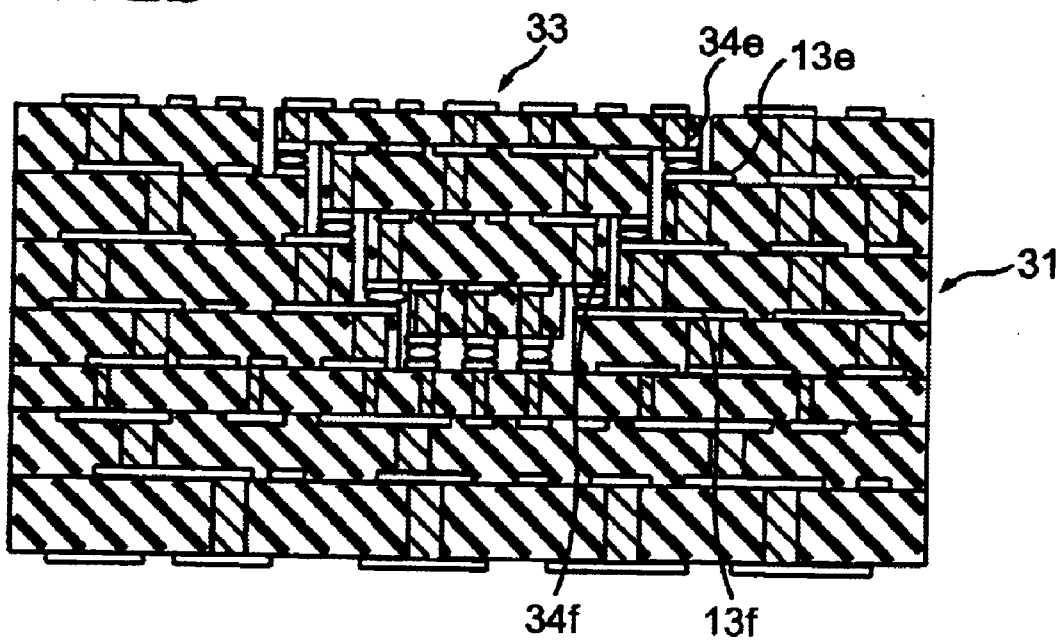

Hereinafter an example of the above feature is described referring to FIG. 2(b). As shown in FIG. 2(b), when a power source wiring layer 13e and a grounding wiring layer 13f are formed on respectively different layers of a plurality of mother boards, these can be electrically connected respectively, with short distance, to a power source terminal 34e and a grounding terminal 34f formed on the corresponding stairs of the staircase structure of the carrier board 33. Accordingly, the power source impedance and the grounding impedance can be reduced.

In the same manner as in the above example, since the terminals of the carrier board can be connected to the corresponding wiring layers on the corresponding stairs of the mother board, larger tolerance in the alignment of electrical connection can be obtained. Accordingly, the production yield in respect to the above electrical connection can be improved.

Third Exemplary Embodiment

Figure 3A:
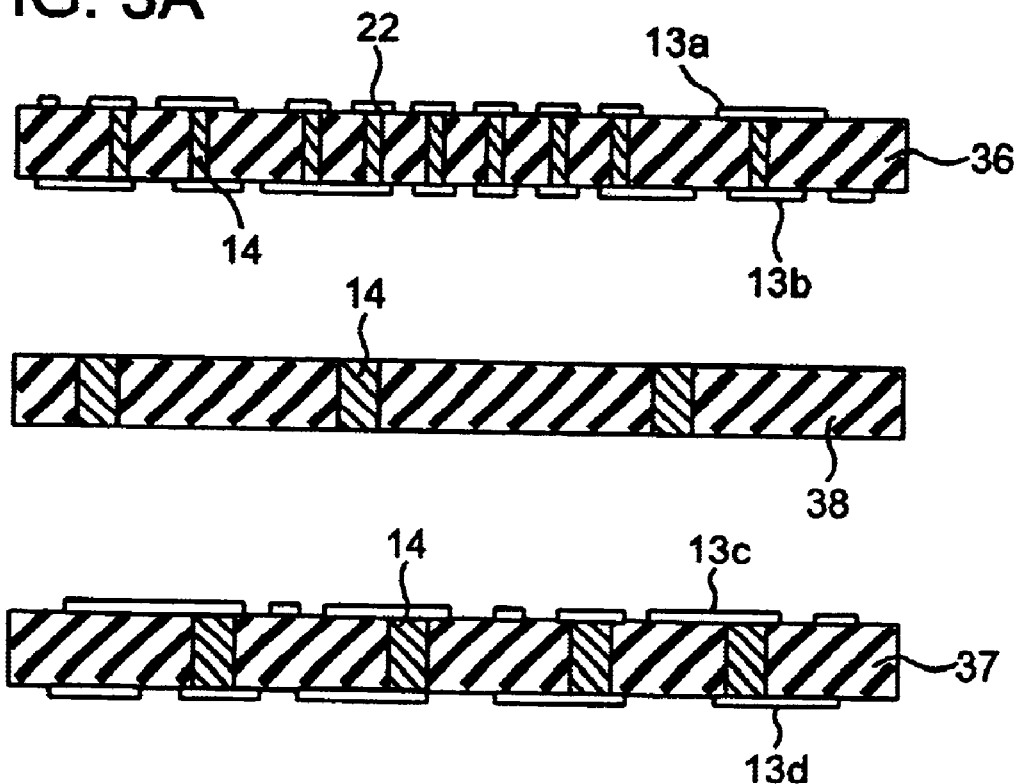
Figure 5A:
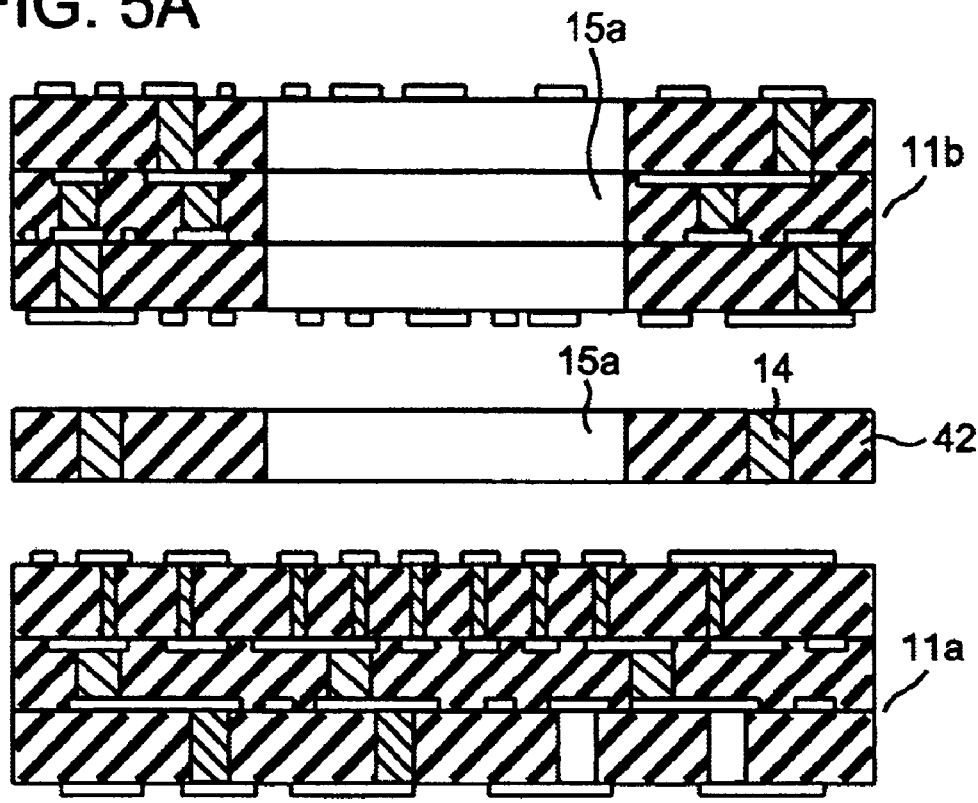
Figure 6A:
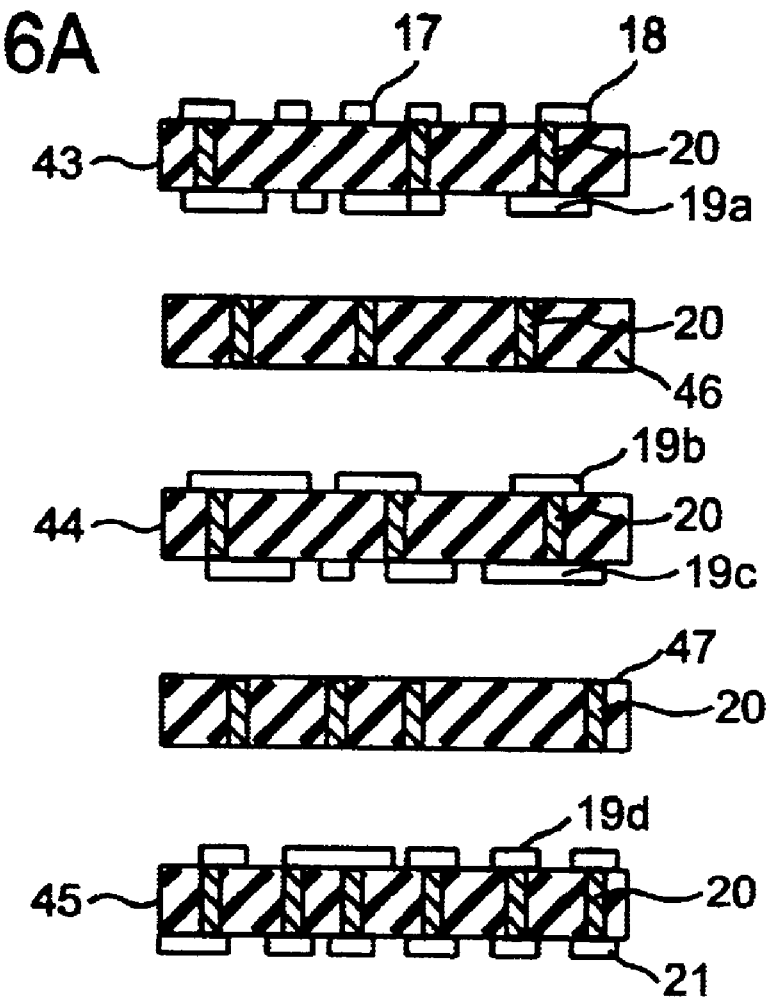
Figure 7A:
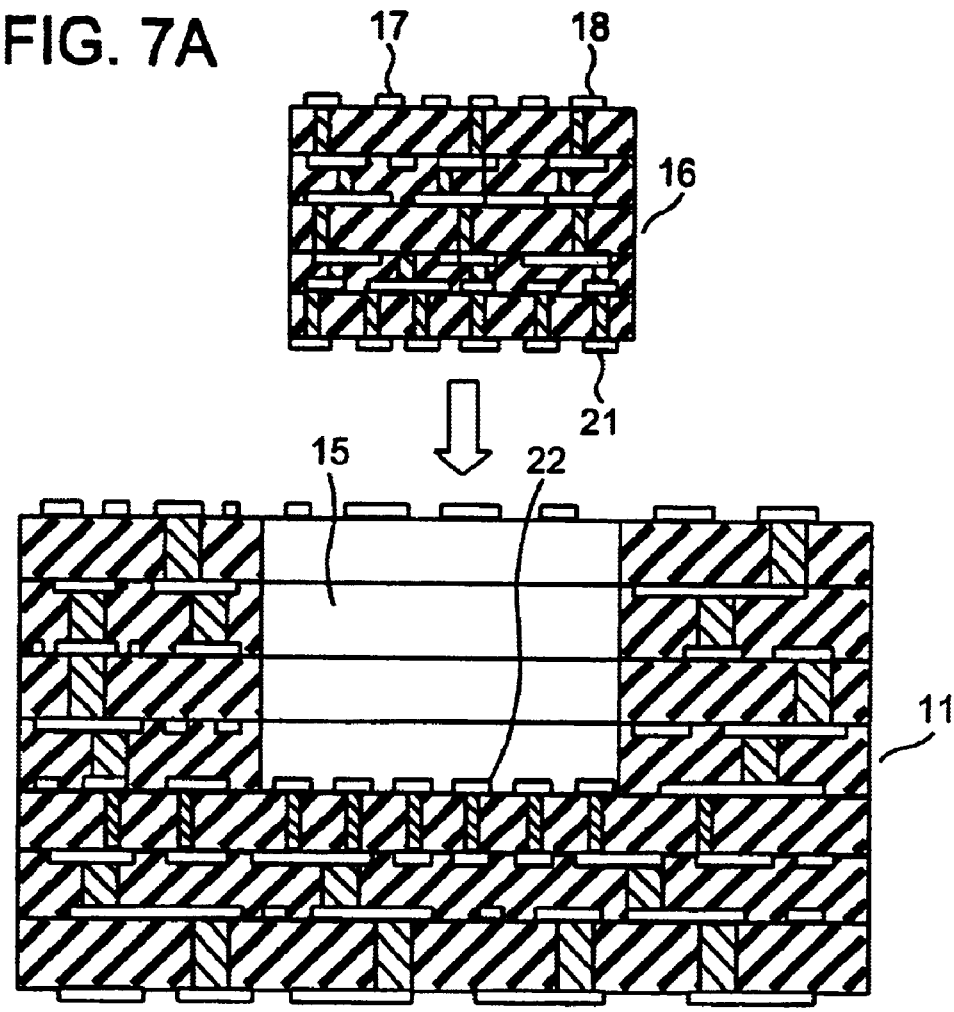

A method of manufacturing a multi-layer circuit board in a third exemplary embodiment of the present invention is described hereinafter referring to FIGS. 3(a) and (b) through FIGS. 7(a) and (b), which show the method of manufacturing a multi-layer circuit board described in the first exemplary embodiment. FIGS. 3(a) and (b) show an assembling process of a base board composing a mother board, FIGS. 3(a) and (b) show an assembling process of a container board composing the mother board, FIGS. 5(a) and (b) show an assembling process of the mother board, FIGS. 6(a) and (b) show an assembling process of a carrier wiring board, and FIGS. 7(a) and (b) show an assembling process of the multi-layer circuit board of the first exemplary embodiment.

First, the assembling process of the base board 11b is described hereinafter referring to FIGS. 3(a) and (b). As shown in FIG. 3(a), double-sided circuit boards 36 and 37 have wiring layers 13a and 13b, and, 13c and 13d on the top side and the bottom side of each of the substrates that compose the circuit boards, and also have first conductors 14 that electrically connect the wiring layers each other.

The substrates on which the wiring layers are formed are generally produced in the manner that non-woven sheet made of glass, aramid, aromatic polyester and the like is impregnated with heat-curing-type-resin of epoxy resin, BT resin (trade name of Mitsubishi Chemical), polyimide resin, modified PPE resin and the like (hereinafter the substrate is referred to as a resin-impregnated-fiber-sheet).

On the top side of the double-sided circuit board 36, mother board electrodes 22 are formed, which are connected to carrier board electrodes (ref. 21 of FIG. 6a) when the carrier board is set in the mother board.

Figure 3B:
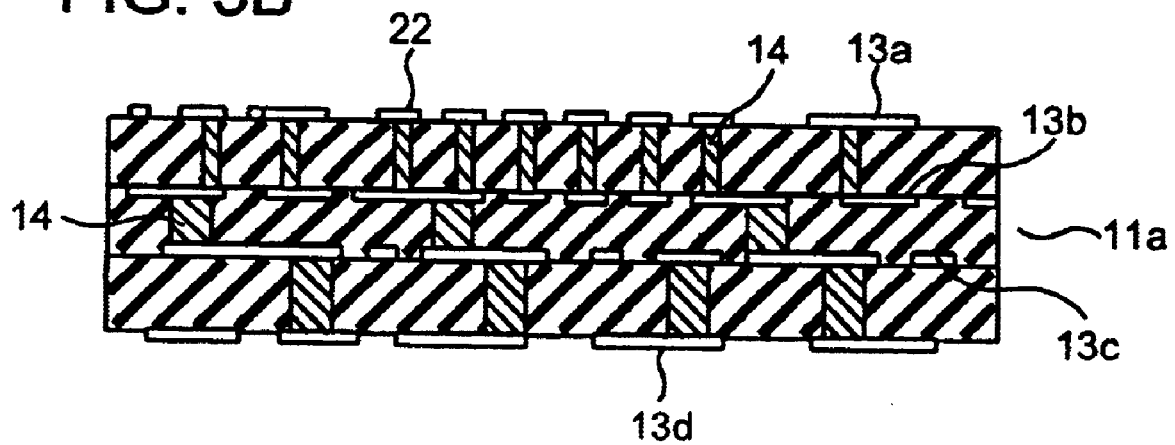

The base board 11a of FIG. 3(b) having four wiring layers 13a, 13b, 13c and 13d connected with each other by the first IVH conductors 14 is formed in the manner that the intermediate connector 38 is sandwiched by the double-sided circuit boards 36 and 37, and these are precisely aligned, and heated and pressed together.

In FIG. 3(a) and (b), the diameter of the first IVH conductor of the double-sided circuit board 36 is different from that of the double-sided circuit board 37. However, the dimension of the diameters can be the same between the two, or can be various dimensions as required.

Figure 4A:
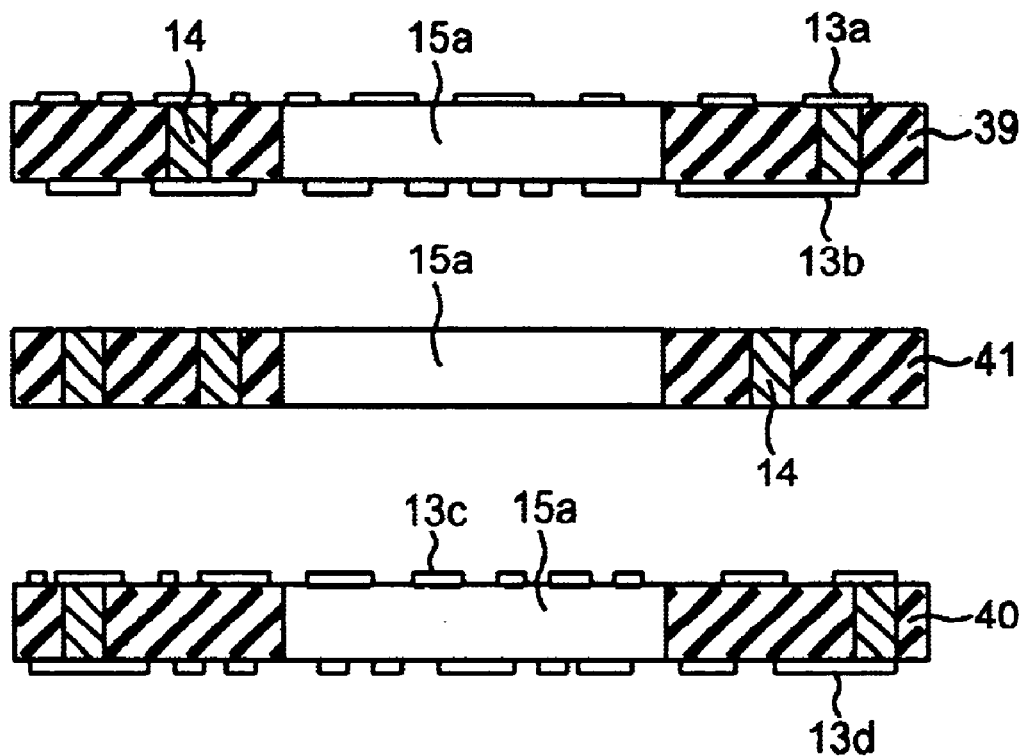
Figure 4B:
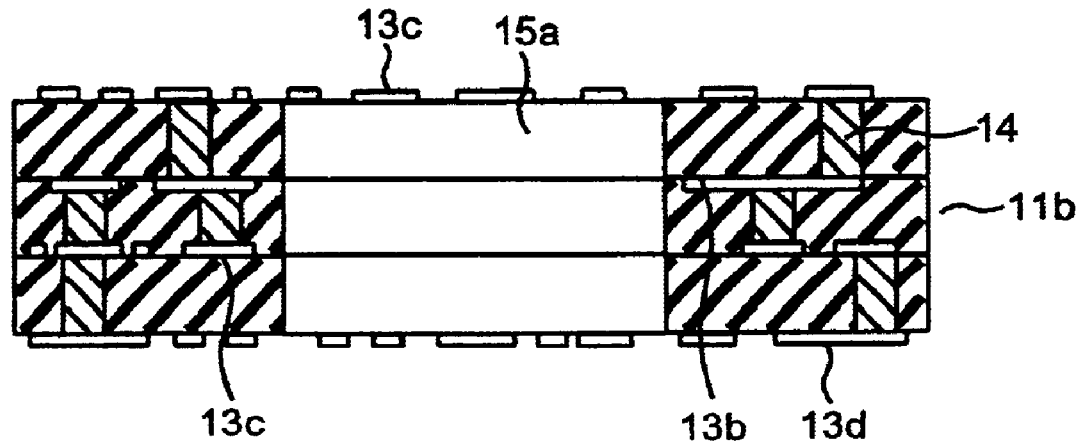

Second, the assembling process of the container board 11b is described hereinafter referring to FIGS. 4(a) and (b). In FIG. 4 (a), double-sided circuit boards 39 and 40 have wiring layers 13a and 13b, and, 13c and 13d respectively on the top side and the bottom side of each of the resin-impregnated-fiber-sheets that compose the circuit boards, and have first IVH conductors 14 that electrically connect the wiring layers with each other and also have at least one opening 15a respectively. When a plurality of openings 15a are formed on the respective double-sided circuit boards 39 and 40, the sizes of the respective openings are determined to correspond to the sizes of the carrier boards (ref. 16 of FIG. 6).

An intermediate connector 41 comprising resin-impregnated-fiber-sheet in the state of B stage (half cured) has through-holes filled with electrically conductive paste or the like for the first IVH conductors, also has an opening 15*a* corresponding to the opening of the double-sided circuit boards 39 and 40.

The container board 11*b* of FIG. 4(*b*) having four wiring layers 13*a*, 13*b*, 13*c* and 13*d* connected with each other by the first IVH conductors 14 is formed in the manner that the intermediate connector 41 is sandwiched by the double sided circuit boards 36 and 37, and, these are precisely aligned, and heated and pressed together.

Figure 5B:
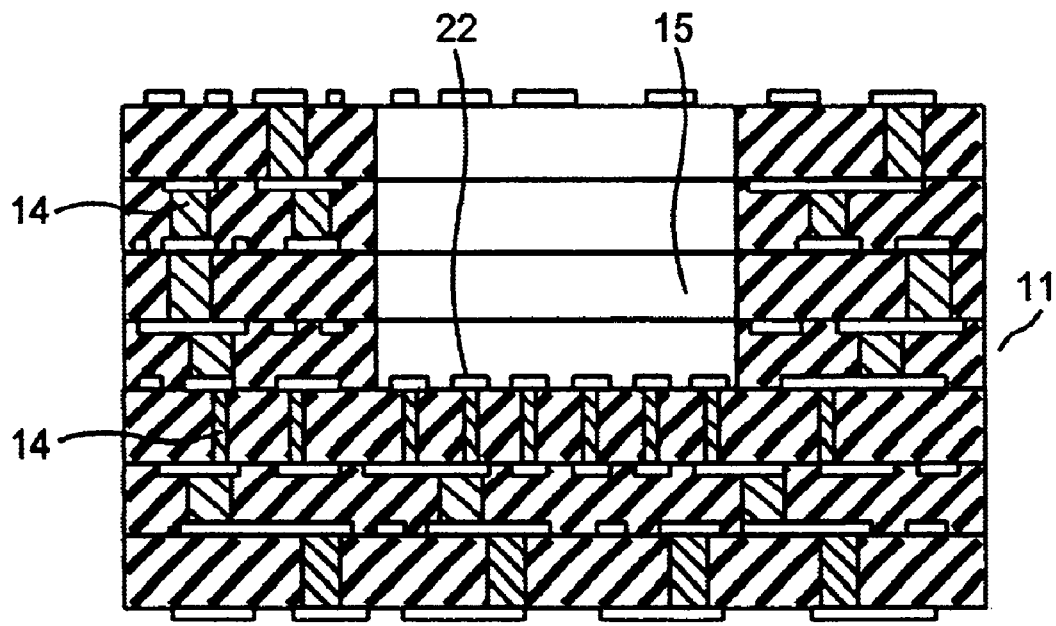

Third, the assembling process of the mother board 11 is described hereinafter referring to FIGS. 5(*a*) and (*b*). In FIG. 5(*a*), an intermediate connector 42 has an opening 15*a* formed through the resin-impregnated-fiber-sheet that composes the connector 42, in which the size of the opening corresponds to that of the container board 11*b*, also has first IVH conductors 14. The mother board 11 of FIG. 5(*b*) in which all of the composing layers have IVH structure, and, the base board 11*a* and the container board 11*b* are electrically connected each other by the first IVH conductors 14 of the intermediate connector 42 is formed in the manner that the intermediate connector 42 is sandwiched by the base board 11*a* and the container board 11*b*, and these are precisely aligned, heated and pressed together. In this process the intermediate connector 42 are cured.

Figure 6B:
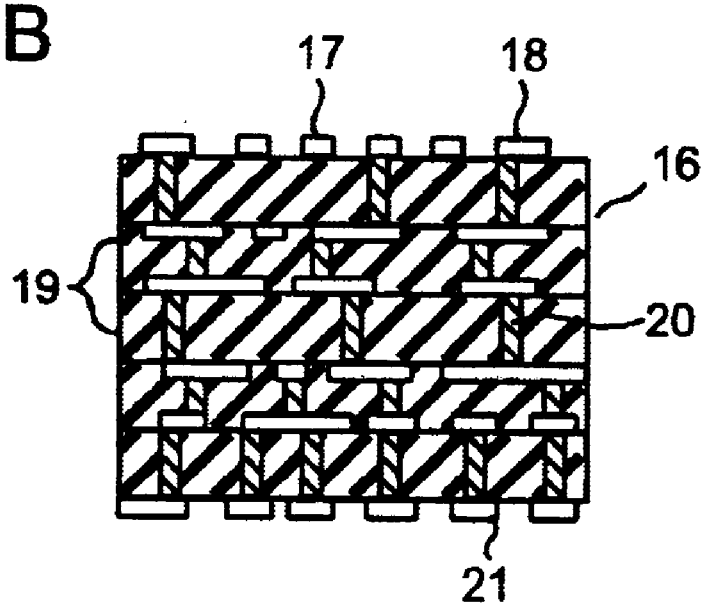

Fourth, the assembling process of the carrier board 16 is described hereinafter referring to FIGS. 6(*a*) and (*b*). In FIG. 6(*a*), an uppermost double-sided-circuit board 43 has lands 17 and wirings 18 on the top side, a carrier-board-wiring-layer 19*a* on the bottom side, and second IVH conductors 20 that electrically connect the wirings 18 and the lands 17 to the carrier-board-wiring-layers 19. The lands 17 are formed in a high density wiring pattern for mounting LSI bare chips having fine pitches.

A double-sided circuit board 44 has carrier-board-wiring-layers 19*a* and 19*c* respectively on the top side and the bottom side of the resin-impregnated-fiber-sheet that composes the circuit board 44, also has second IVH conductors 20. A double-sided circuit board 45 has carrier-board-wiring-layers 19*d* on the top side, carrier board electrodes 21 on the bottom side, and second IVH conductors 20. Intermediate connectors 46 and 47 respectively have second IVH conductors 20 for electrically connecting the double-sided circuit boards 43, 44 and 45 each other.

A carrier board 16 of FIG. 6(*b*) in which all of the composing layers have IVH structure is formed in the manner that the above circuit boards and connectors are placed in the order of FIG. 6, and are precisely aligned, heated and pressed together. In this process the intermediate connectors 46 and 47 cure.

Figure 7B:
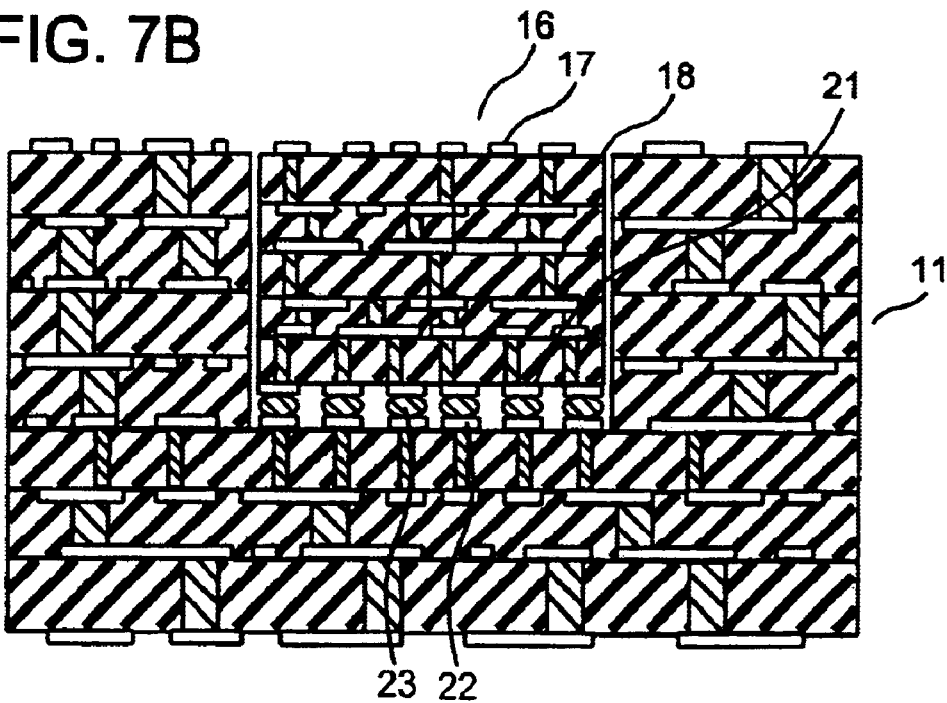

Finally, as shown in FIGS. 7(*a*) and (*b*), the multi-layer circuit board of the present invention comprising different types of circuit boards can be obtained by setting the carrier board 16 in the cavity 15 of the mother board 11, in which carrier board electrodes 21 formed on the bottom side of the carrier board 16 are electrically connected to mother board electrodes 22 formed on the bottom of the cavity 15, through connectors 23 of solder balls, gold bumps or electrically conductive paste.

In this case, the carrier board 16 can be set in the cavity 15 of the mother board 11 after LSI chips are mounted on the lands 17 of the carrier board 16. Also, FIG. 1 and FIG. 7(*b*) show the examples that the top of the mother board and the top of carrier board are on the same level. However, the top of carrier board 16 can be formed to be at a lower level than the top of the mother board 11 so that the thickness of the multi-layer circuit board can be suppressed by reducing the increase of thickness caused by the protection resin layer for covering the LSI bare chips mounted on the lands 17.

Fourth Exemplary Embodiment

A method of manufacturing a multi-layer circuit board having staircase structure in a fourth exemplary embodiment of the present invention is described hereinafter referring to FIG. 8 through FIG. 13, in which the same reference numerals are applied as in FIG. 1 and FIG. 2 for the same components.

Figure 8A:
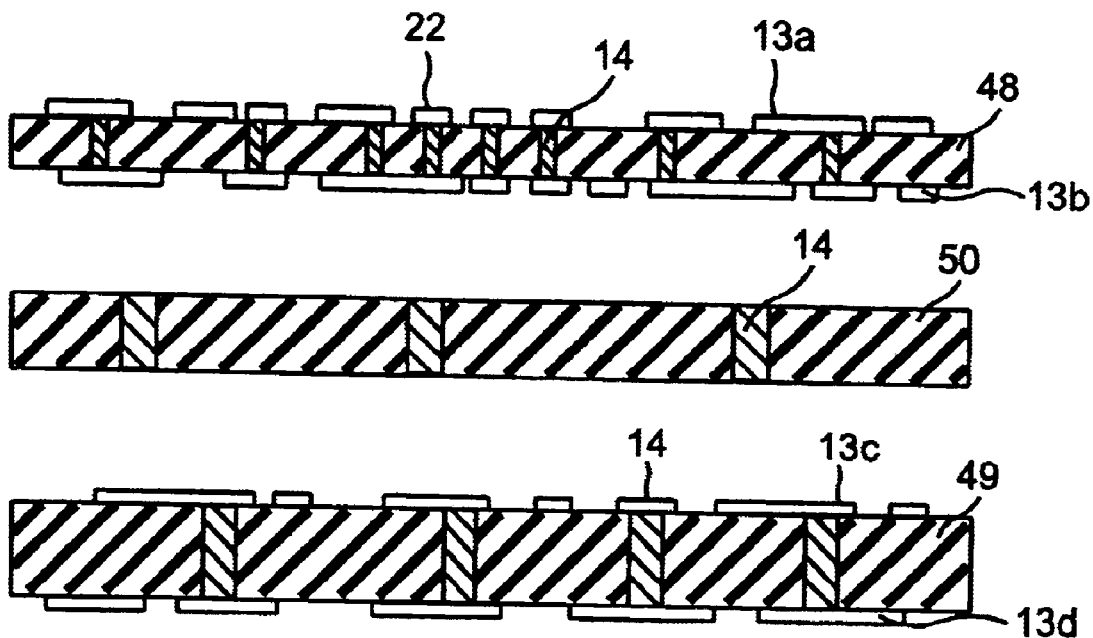
Figure 8B:
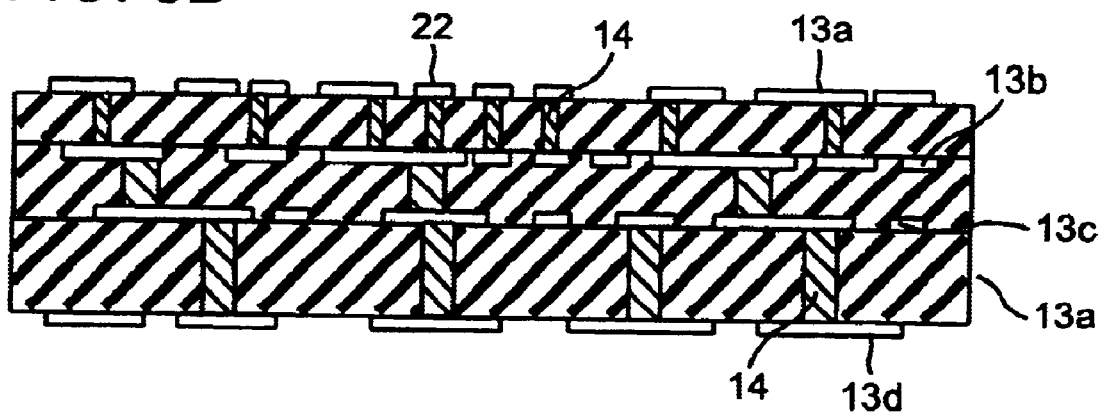
Figure 9A:
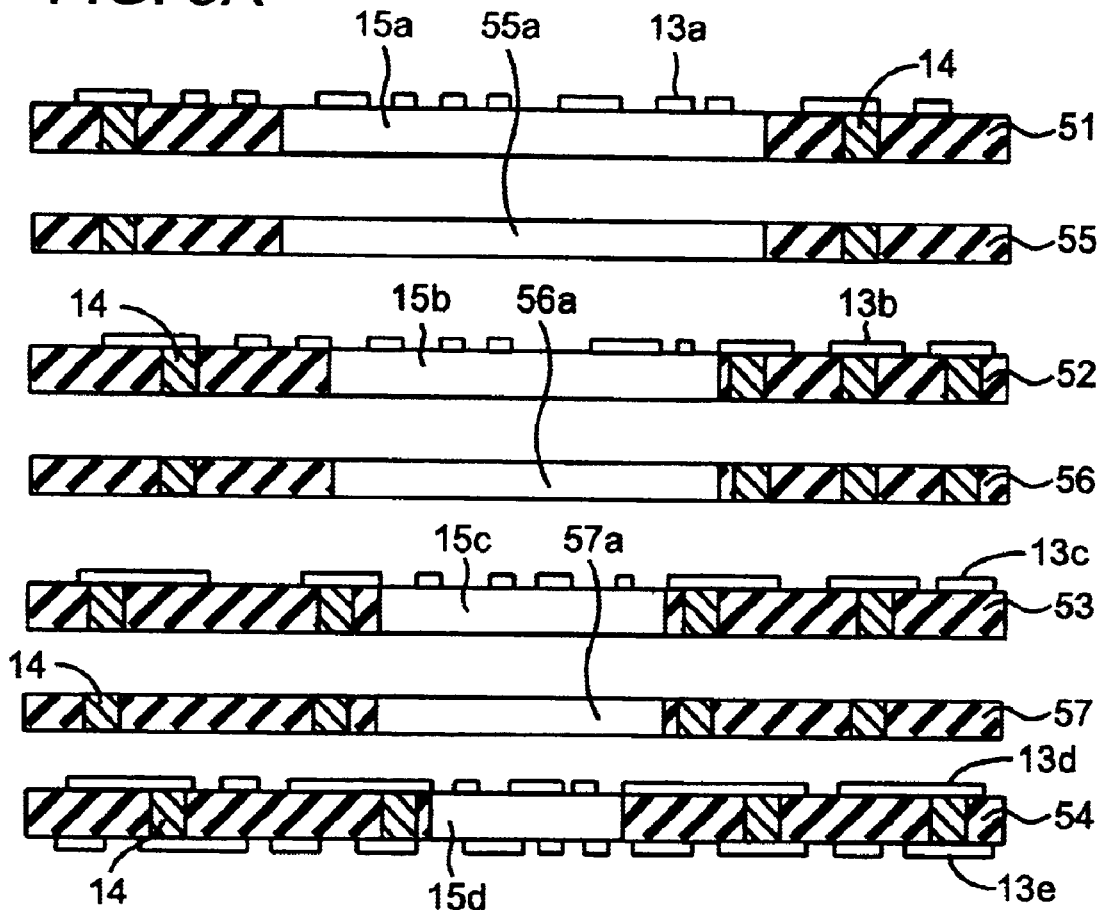

FIGS. 8(*a*) and (*b*) show an assembling process of a base board composing a mother board, FIGS. 9(*a*) and (*b*) show an assembling process of a container board composing the mother board, FIGS. 10(*a*) and (*b*) show an assembling process of a container board having another structure for composing a mother board, FIGS. 11(*a*) and (*b*) show an assembling process of a mother board by connecting the base board of FIG. 8 to the container board of FIG. 9. FIGS. 12(*a*) and (*b*) show an assembling process of a carrier board, and, FIGS. 13(*a*) and (*b*) show an assembling process of a multi-layer circuit board of the fourth exemplary embodiment having a staircase structure by assembling the mother board and the carrier board.

First, the assembling process of the base board 31*a* is described referring to FIGS. 8(*a*) and (*b*). In FIG. 8(*a*), double-sided circuit boards 48 and 49 respectively have wiring layers 13*a* and 13*b*, and, 13*c* and 13*d* on the top side and the bottom side of the respective resin-impregnated-fiber-sheets that compose the circuit boards, also have first IVH conductors that connect the wiring layers with each other. On the top side of the double-sided circuit board 48, mother board electrodes 22 for connecting to the carrier electrodes (described later) of the carrier board are formed. Intermediate connector 50 has first IVH conductors formed in the manner that electrically conductive paste or the like is filled into a plurality of through-holes formed on the resin-impregnated-fiber-sheet of B stage.

The base board 31*a* of FIG. 8(*b*) having the four wiring layers 13*a*, 13*b*, 13*c* and 13*d* electrically connected with each other by the first IVH conductors is formed in the manner that the intermediate connector 50 is sandwiched by the double-sided circuit boards 48 and 49, and these are precisely aligned, heated and pressed together.

FIG. 8(*a*) shows an example that the double-sided circuit boards 48 and 49 having the IVH conductors of respectively different diameters. However the dimension of the diameters can be the same, or can be various dimensions (as required). The base board 31*a* of FIG. 8(*b*) of this exemplary embodiment has fewer number of electrodes 22 than in the base board 11*a* of FIG. 3(*b*) of the first exemplary embodiment.

Second, the assembling method of container board 31*b* of this exemplary embodiment having a cavity of a staircase-shape is described hereinafter referring to FIGS. 9(*a*) and (*b*). In FIG. 9(*a*), single-side-circuit boards 51, 52 and 53 respectively have wiring layers 13*a*, 13*b* and 13*c* on one side of each of the resin-impregnated-fiber-sheets that compose the circuit boards, first IVH conductors 14, and at least one respective openings 15*a*, 15*b* and 15*c* that are different from each other in size. A double-sided circuit board 54 composing a lowermost wiring board of the container board 31*b* has wiring layers 13*d* and 13*e*, and, IVH conductors 14.

Intermediate connectors 55, 56 and 57 respectively sandwiched by the circuit boards 51, 52, 53 and 54 as shown in FIG. 9 respectively have first IVH conductors formed in through-holes formed on the respective resin impregnated-fiber-sheets of B stage that compose the intermediate connectors, also, respectively have openings 55a, 56a and 57a whose sizes correspond to those of wiring boards locating at respective upper sides.

Figure 9B:
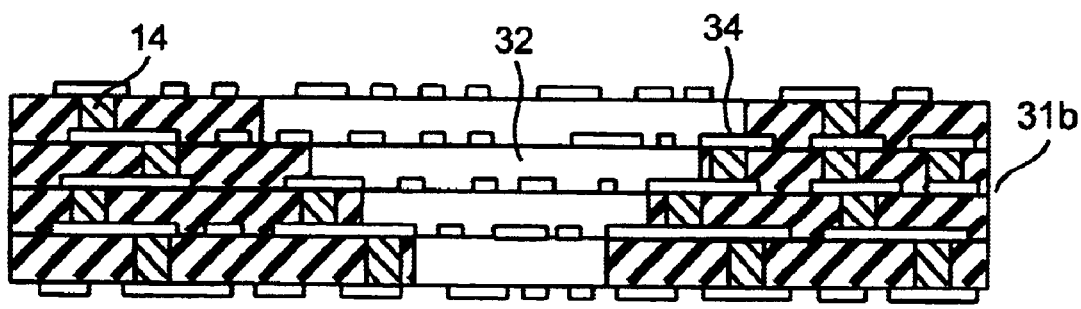

The staircase-shape container board 31b of FIG. 9(b) having five wiring layers, three contact stairs and first IVH conductors connecting wiring layers 13a, 13b, 13c, 13d and 13e with each other is formed in the manner that above the circuit boards and the intermediate connectors are placed in the order as shown in FIG. 9, and these are precisely aligned and heated and pressed together.

Third, the assembling process of another example of a staircase-shape container board is described hereinafter referring to FIGS. 10(a) and (b). A staircase-shape container board 108 of FIG. 10(b) having six wiring layers and two contact stairs is formed in the manner that double-sided circuit boards 101, 102 and 103 respectively having wiring layers 104a and 104b, 104c and 104d, and, 104e and 104f, and different size openings 105a, 105b, and 105c are laminated, in which intermediate connectors 106 and 107 having openings 106a and 107b whose sizes correspond to those of the wiring layer of respective upper sides are sandwiched by the circuit boards 101, 102 and 103 as shown in FIG. 10(a).

In the container board of this exemplary embodiment, as described above, the number of contact stairs and the number of wiring layers are determined according to the circuit structure of applied electronic equipment or the type of mounted LSI bare chips by forming the container board with the combination of the single-side-circuit boards and the double-side-circuit boards.

Figure 11A:
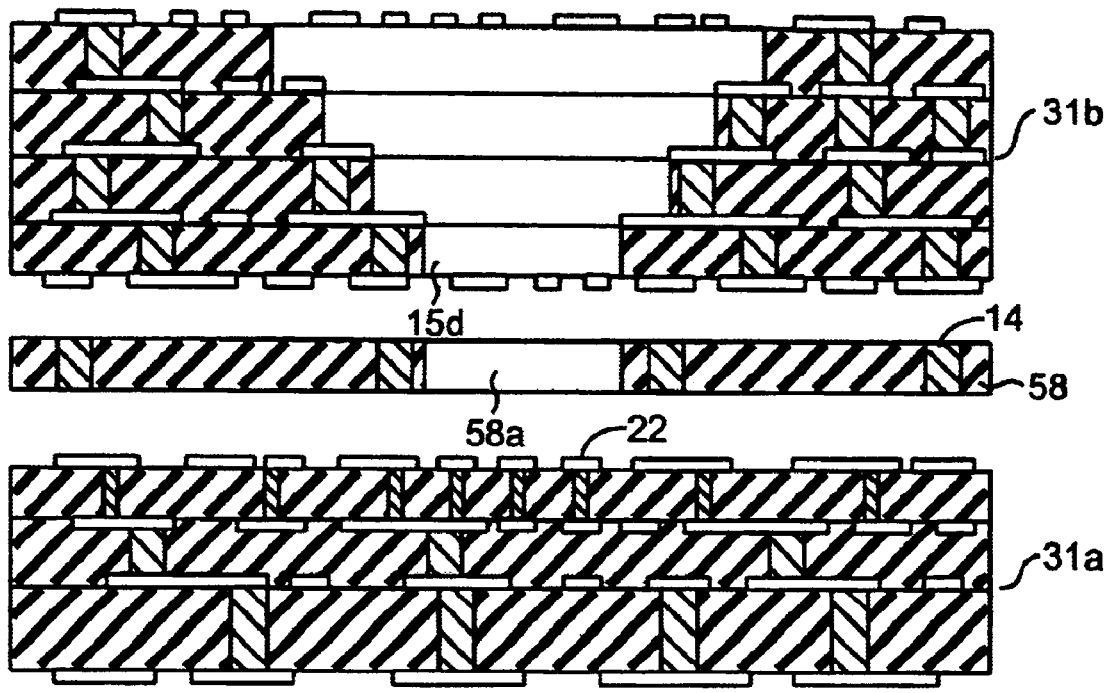
Figure 11B:
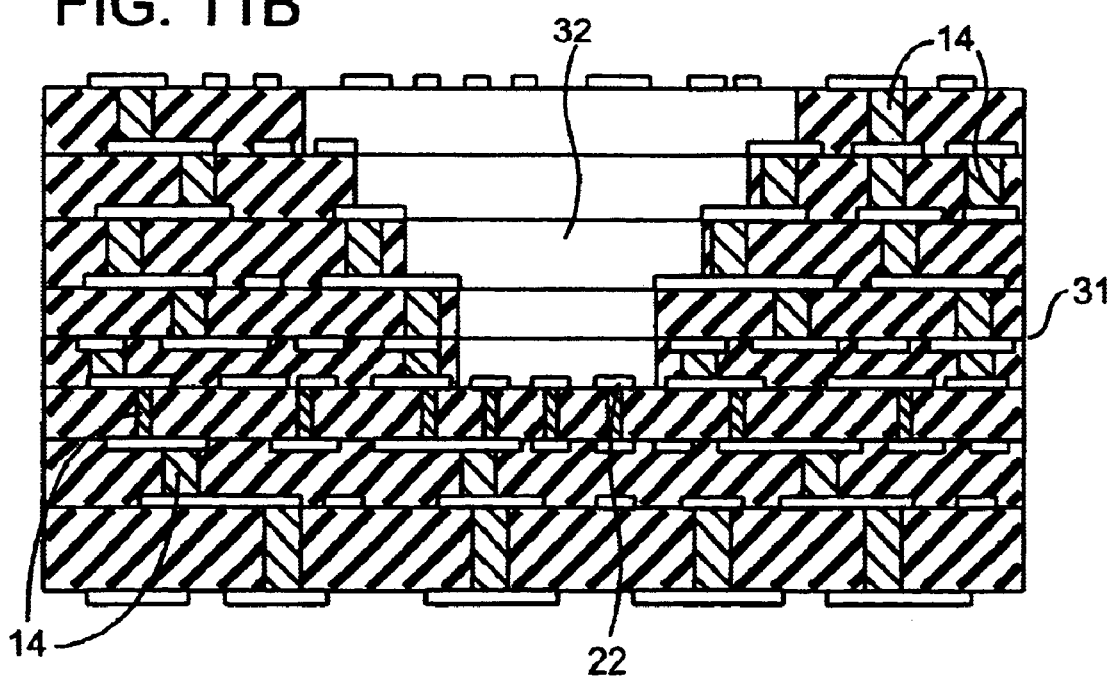

Fourth, an assembling method of the mother board 31 of this exemplary embodiment is described hereinafter referring to FIGS. 11(a) and (b). The mother board 31 of FIG. 11(b) in which all of the composing layers have IVH structure is formed in the manner that an intermediate connector 58 is sandwiched by the above base board 31a and container board 31b, and these are precisely aligned, and heated and pressed together. In this process the intermediate connector 58 is cured. In this case, the intermediate connector 58 has an opening whose size is substantially the same as the opening 15d of the bottom of the container board 31b, and also has first IVH conductors 14.

Figure 12A:
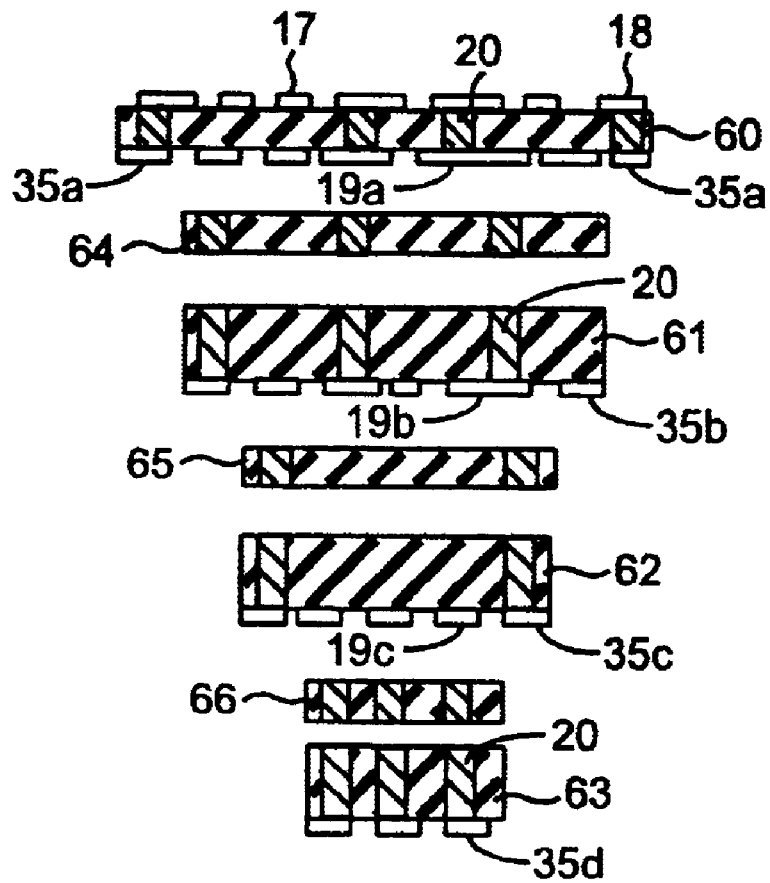

Fifth, an assembling method of a carrier board 33 of FIGS. 2(a) and (b) is described referring to FIGS. 12(a) and (b). In FIG. 12(a), a first double sided circuit board 60 has the structure that lands 17 and wiring 18 are formed on the top side, a carrier wiring layers 19a and carrier board electrodes 35a are formed on the bottom side, and second IVH conductors 20 are formed in through-holes of the resin-impregnated-fiber-sheet that composes the circuit board 60. The lands 17 are formed in a high density pattern for corresponding to the terminal pitches of mounted LSI bare chips.

A second circuit board 61 and a third circuit board 62 are respectively formed in the manner that carrier-board-wiring-layers 19b and 19c, and, carrier electrodes 35b and 35c are respectively formed on one side of the resin-impregnated-fiber-sheets that compose the circuit boards, and, second IVH conductors 20 are respectively formed in the through-holes of the respective resin-impregnated-fiber-sheets. A fourth circuit board 63 is formed in the manner that carrier electrodes 35d are formed on the bottom side of the resin-impregnated-fiber-sheet that comose the circuit board 63, and second IVH conductors 20 are formed in the through-holes of the resin-impregnated-fiber-sheets.

Figure 12B:
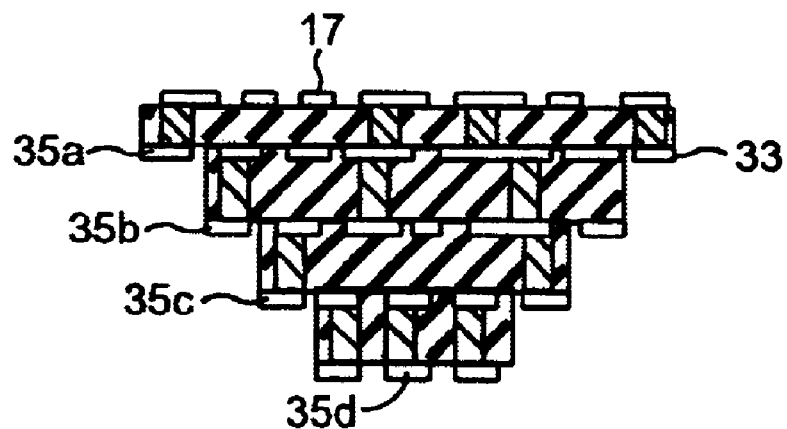

Intermediate connectors 64, 65 and 66 respectively have second IVH conductors 20 formed by filling electrically conductive paste or the like into through-holes formed on the respective resin-impregnated-fiber-sheets of B stage. The sizes of the respective intermediate connectors are determined to be smaller than the circuit boards located at the upper side of the respective intermediate connectors so that the electrodes formed on the respective circuit boards are exposed as shown in FIG. 12(b).

The reversed-staircase-shape carrier board 33 having four contact stairs, five wiring layers and exposed electrodes 35a, 35b, 35c and 35d formed on the flat portions of the four contact stairs is formed in the manner that the above boards and the conductors are placed in the order of FIG. 12, and these are precisely aligned, heated and pressed together.

The reversed-staircase-shape carrier board of this exemplary embodiment can be formed with the other combination of single-side-circuit boards and double-sided circuit boards than that of the above description, as in the case of the staircase-shape container circuit board 31b.

Figure 13A:
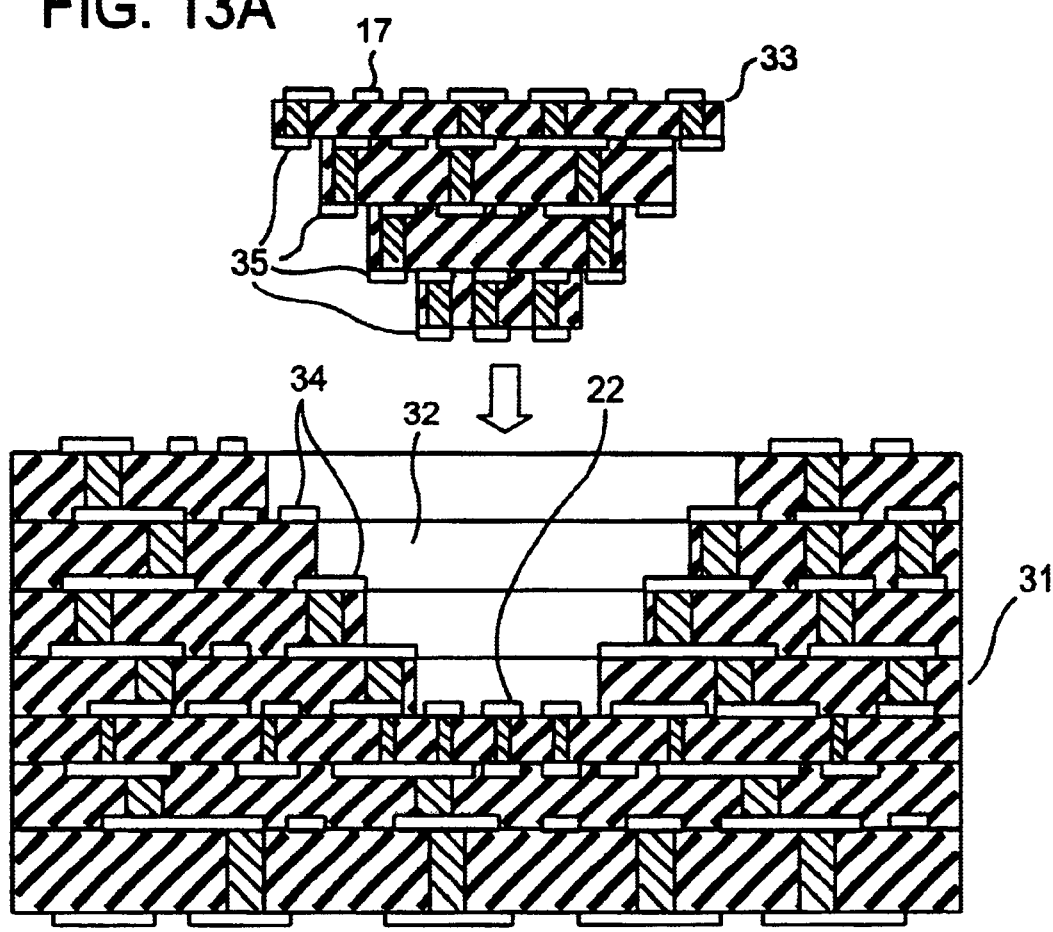
Figure 13B:
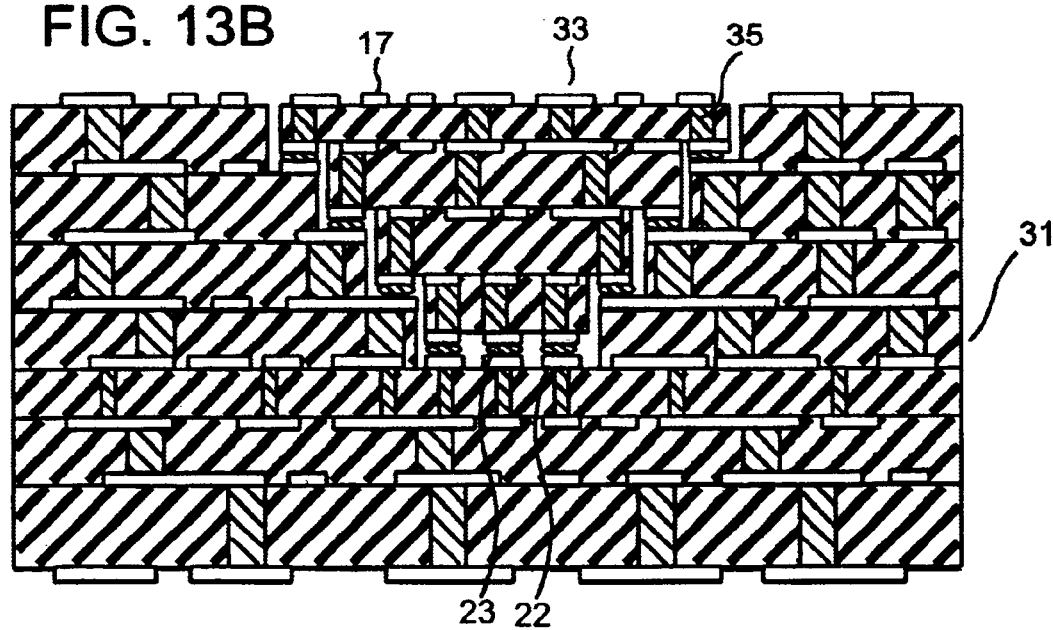
Figure 14:
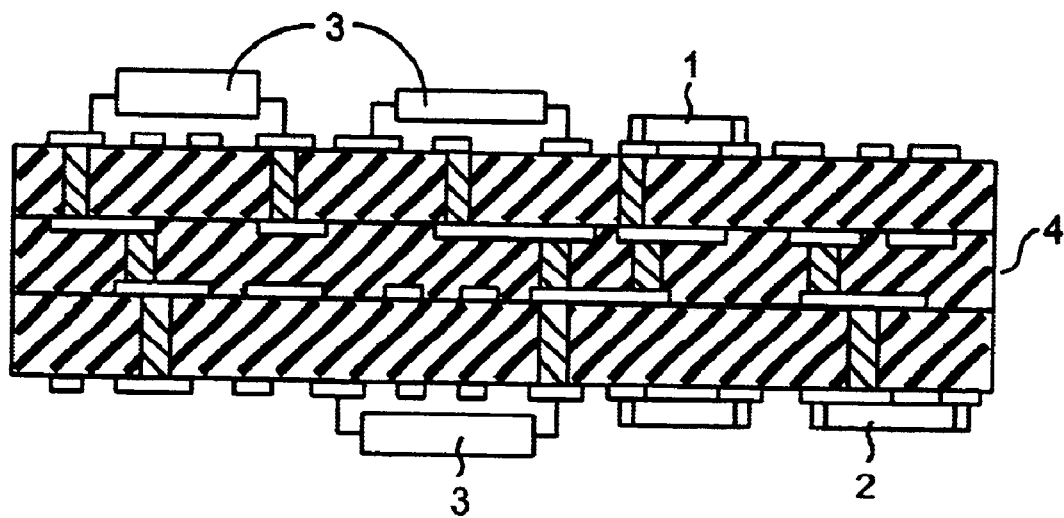
FIG. 14 is a cross sectional view showing an example that electronic components are mounted on a conventional multi-layer circuit board in which all of the composing layers have IVH structure.

Finally, as shown in FIG. 13, the multi-layer circuit board of the present invention comprising different types of circuit boards can be obtained by setting the carrier board 33 in the staircase-shape cavity 32 of the mother board 31, in which the carrier board electrodes 35 formed on the exposed flat portions of the carrier board 33 are connected to the mother board electrodes 22 and 34 formed on the flat portions of the cavity 32, through connectors 23 of solder balls, gold bumps or electrically conductive paste.

As described above, in the present invention, a low cost mother board having relatively low wiring density is manufactured separately from a high cost carrier board having high wiring density for directly mounting LSI bare chips at the former manufacturing processes, and these are integrated and electrically connected with each other in the manufacturing processes for completing a multi-layer circuit board. Accordingly the cost for the designing and the manufacturing of the multi-layer circuit board can be reduced, the structure can be modified for fitting to respective requirements, and superior electrical characteristics and high reliability of electrical connection can be obtained.

What is claimed is:

1. A method of manufacturing a multi-layer circuit board, which comprises the steps of:
   (a) forming a base board by laminating a plurality of resin-impregnated-fiber-sheets respectively having wiring layers on surfaces thereof and inner-via-hole conductors therein;
   (b) forming a container board by laminating a plurality of resin-impregnated-fiber-sheets respectively having wiring layers on the surfaces thereof, inner-via-hole conductors therein, and at least one opening therethrough;
   (c) forming a mother board having at least one cavity by laminating said base board and said container board;
   (d) forming a carrier board by laminating a resin-impregnated-fiber-sheet having at least one land and at least one wiring on the surface thereof, and a plurality of resin-impregnated-fiber-sheets respectively having inner-via-hole conductors therein;
   (e) locating said carrier board in said cavity of said mother board; and (f) electrically connecting said carrier board to said mother board, wherein a wiring density formed on the carrier board is different from the wiring density formed on the mother board.

2. The method of claim 1, wherein the wiring density formed on the carrier board is greater than a wiring density formed on the mother board.

3. The method of claim 1, further comprising a step (f) of filing the remaining space of the cavity with sealing resin.

4. The method of claim 1, wherein said cavity has a staircase-shape and said carrier board has a reversed staircase-shape so as to fit within said cavity.

5. The method of claim 1, wherein an electric power source terminal and a grounding terminal of said carrier board are electrically connected to an electric power source layer and a grounding layer of said mother board, respectively.

6. The method of claim 1, wherein, said carrier board further comprises:
   wiring formed on a surface thereof;
   a plurality of wiring layers formed therein; and
   inner-via-hole conductors for electrically connecting said wiring layers with each other.

7. The method of claim 1, wherein said carrier board has at least one land on a surface thereof for mounting an electronic component.

8. The method of claim 1, wherein at least one of said mother board and said carrier board has at least one wiring layer having a wiring density different from a wiring density of the other wiring layers thereon.

9. The method of claim 1, wherein said carrier board is electrically connected to said mother board through one of solder balls, gold bumps and conductive paste.

10. A method of manufacturing a multi-layer circuit board, comprising the steps of:
   (a) providing a mother board comprising at least one cavity and at least one mother board electrode within the cavity;
   (b) providing a carrier board comprising at least one carrier board electrode on a surface of the carrier board;
   (c) locating the carrier board in the cavity of the mother board; and
   (d) electrically connecting the mother board electrode with the carrier board electrode,
      wherein a wiring density formed on the carrier board is different from the wiring density formed on the mother board.

11. The method of claim 10, wherein the wiring density formed on the carrier board is greater than a wiring density formed on the mother board.

12. The method of claim 10, further comprising a step (f) of filling the remaining space of the cavity with sealing resin.

13. The method of claim 10, wherein said cavity has a staircase-shape and said carrier board has a reversed staircase-shapes so as to fit within said cavity.

14. The method of claim 10, wherein an electric power source terminal and a grounding terminal of said carrier board are electrically connected to an electric power source layer and a grounding layer of said mother board, respectively.

15. The method of claim 10, wherein, said carrier board further comprises:
   wiring formed on a surface thereof;
   a plurality of wiring layers formed therein; and
   inner-via-hole conductors for electrically connecting said wiring layers with each other.

16. The method of claim 10, wherein said carrier board has at least one land on a surface thereof for mounting an electronic component.

17. The method of claim 10, wherein said carrier board is electrically connected to said mother board through one of solder balls, gold bumps and conductive paste.

18. The method of claim 10, wherein a material comprising at least one of said mother board and said carrier board is a resin-impregnated-fiber-sheet made of one of composite of glass-fiber-nonwoven-fabric and thermosetting resin and composite of organic-fiber-nonwoven-fabric and thermosetting resin.

* * * * *